(12) United States Patent
Nozoe et al.

(10) Patent No.: US 8,421,008 B2
(45) Date of Patent: Apr. 16, 2013

(54) PATTERN CHECK DEVICE AND PATTERN CHECK METHOD

(75) Inventors: Mari Nozoe, Hino (JP); Hiroshi Miyai, Hitachi (JP); Mitsuru Okamura, Mito (JP); Makoto Suzuki, Hitachinaka (JP); Yusuke Ominami, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 77 days.

(21) Appl. No.: 13/129,201

(22) PCT Filed: Oct. 15, 2009

(86) PCT No.: PCT/JP2009/005372
§ 371 (c)(1),
(2), (4) Date: Aug. 2, 2011

(87) PCT Pub. No.: WO2010/055610
PCT Pub. Date: May 20, 2010

(65) Prior Publication Data
US 2011/0278452 A1    Nov. 17, 2011

(30) Foreign Application Priority Data

Nov. 14, 2008   (JP) ................................. 2008-291624

(51) Int. Cl.
*H01J 37/26*     (2006.01)
*H01J 37/304*    (2006.01)
*G01N 23/00*     (2006.01)

(52) U.S. Cl.
USPC ...... 250/306; 250/307; 250/310; 250/492.22; 250/402.2; 250/492.3

(58) Field of Classification Search .................. 250/306, 250/307, 310, 492.22, 492.2, 492.3
See application file for complete search history.

(56) References Cited

U.S. PATENT DOCUMENTS

| | | | |
|---|---|---|---|
| 6,172,363 B1 | 1/2001 | Shinada et al. | |
| 6,366,014 B1 * | 4/2002 | Kuroda et al. | 313/495 |

(Continued)

FOREIGN PATENT DOCUMENTS

| | | |
|---|---|---|
| JP | 61-193351 | 8/1986 |
| JP | 08-195181 | 7/1996 |

(Continued)

*Primary Examiner* — Nikita Wells
(74) *Attorney, Agent, or Firm* — McDermott Will & Emery LLP

(57) ABSTRACT

Provided is a pattern inspection apparatus including: a charge formation means which forms charge on a surface of a substrate (7) by generating an electron beam from a second electron source (20) which is different from an electron source (1) which generates an electron beam before irradiating an electron beam (3), a current measuring means (34) which measures a value of current flowing in the substrate while the charge is formed on the surface of the substrate by the charge formation means; and an adjustment means (37) which adjusts the charge formed by the charge formation means so that the value of the current measured by the current measuring means is a predetermined target value. Provided is also a pattern inspection method which uses the pattern inspection apparatus. Thus, it is possible to easily set an optimal condition of precharge executed before inspection of a pattern formed by a semiconductor apparatus manufacturing process and automatically inspection whether the precharge is good. Then, the inspection result is fed back to the operation afterward. This prevents lowering of the reliability of the inspection result and always enables a stable inspection.

16 Claims, 12 Drawing Sheets

U.S. PATENT DOCUMENTS

| | | |
|---|---|---|
| 6,853,204 B2 * | 2/2005 | Nishiyama et al. ...... 324/750.02 |
| 7,728,294 B2 | 6/2010 | Hiroi et al. |
| 2006/0289755 A1 | 12/2006 | Koyama et al. |
| 2007/0040118 A1 | 2/2007 | Cheng et al. |

FOREIGN PATENT DOCUMENTS

| | | |
|---|---|---|
| JP | 10-125271 | 5/1998 |
| JP | 10-294345 | 11/1998 |
| JP | 11-174008 | 7/1999 |
| JP | 2002-216698 | 8/2002 |
| JP | 2003-100823 | 4/2003 |
| JP | 2006-338881 | 12/2006 |
| JP | 2007-053035 | 3/2007 |
| JP | 2007-329337 | 12/2007 |

* cited by examiner (a)

(b)

(a)

(b)

■ : ELECTRON IRRADIATION ON
▓ : ELECTRON IRRADIATION OFF

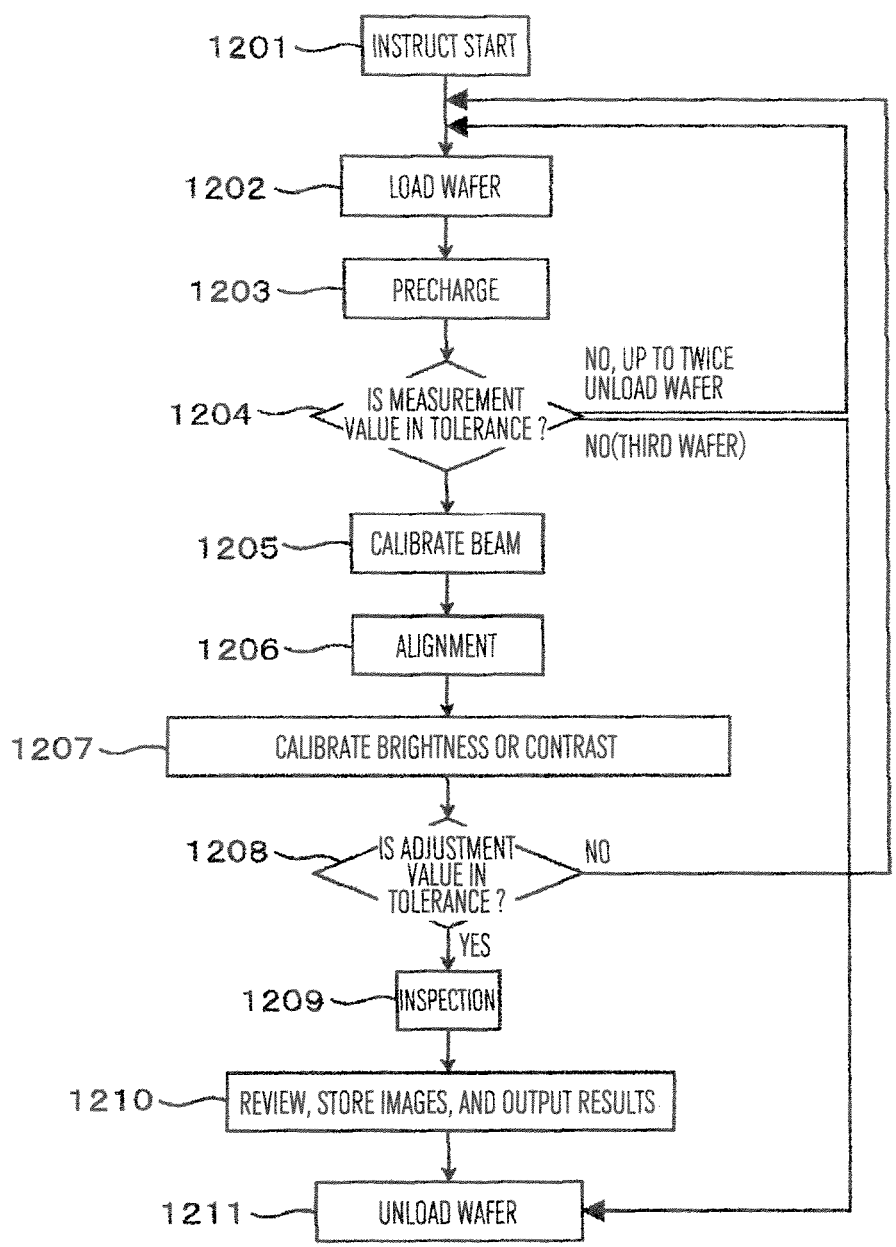

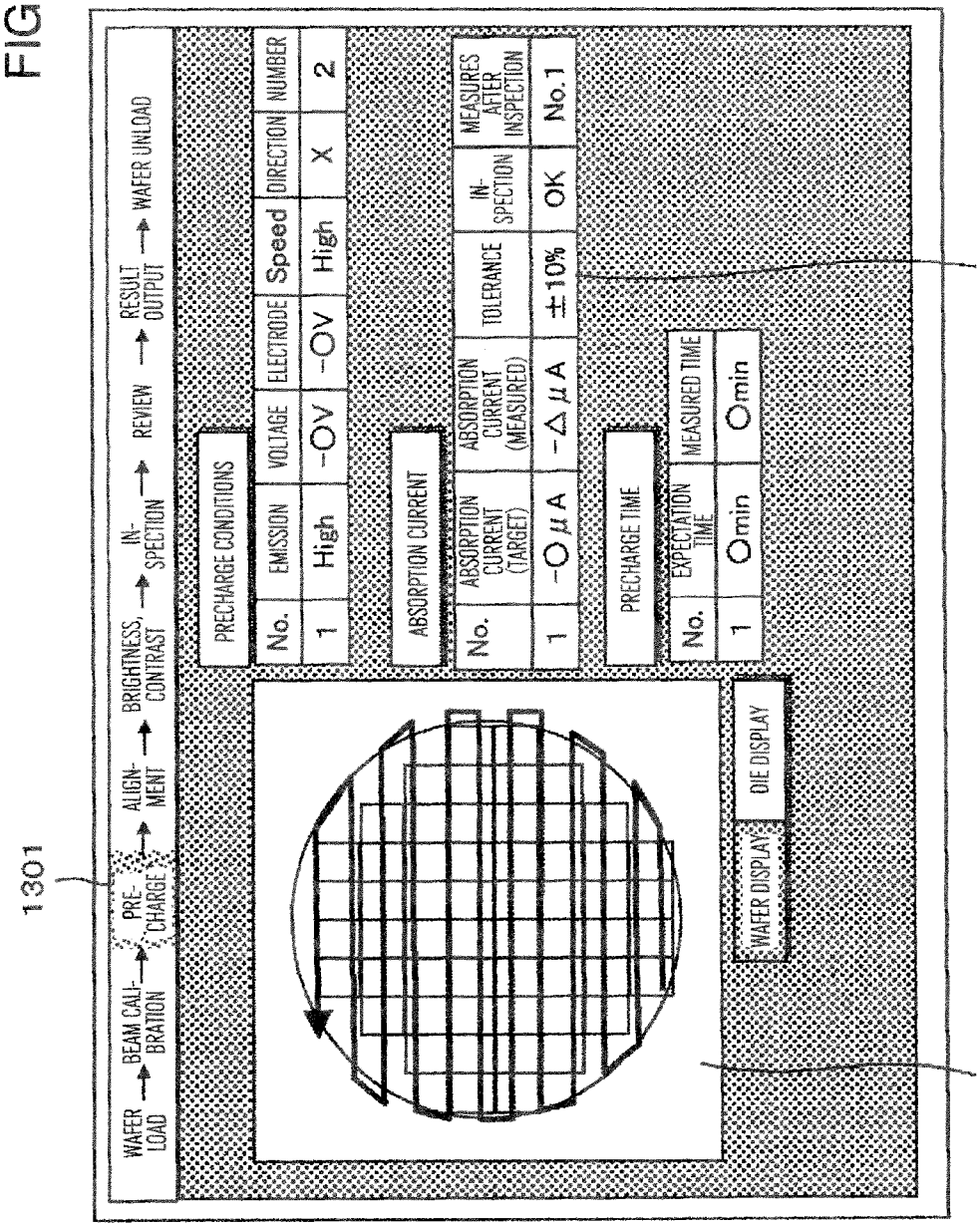

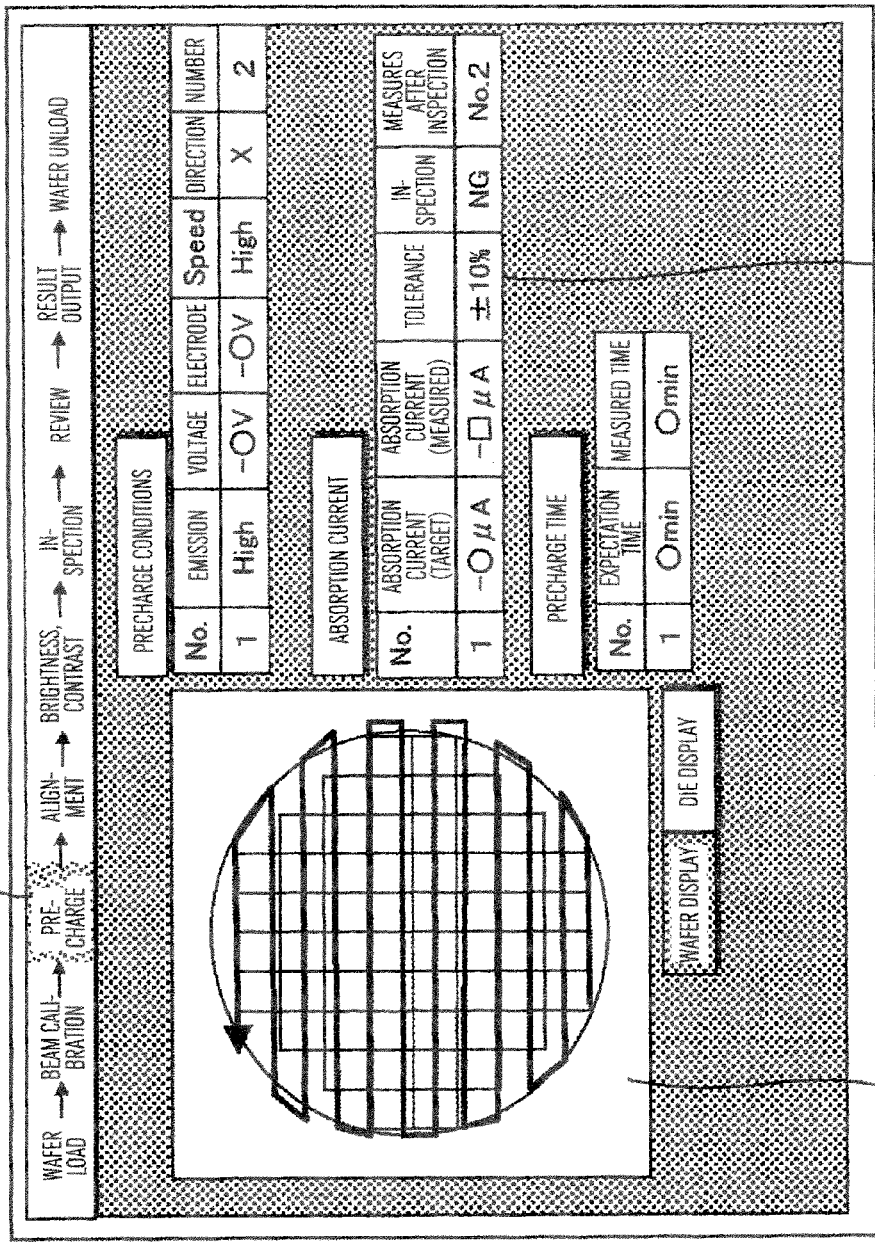

PATTERN CHECK DEVICE AND PATTERN CHECK METHOD

RELATED APPLICATIONS

This application is the U.S. National Phase under 35 U.S.C. §371 of International Application No. PCT/JP2009/005372, filed on Oct. 15, 2009, which in turn claims the benefit of Japanese Application No. 2008-291624, filed on Nov. 14, 2008, the disclosures of which Applications are incorporated by reference herein.

TECHNICAL FIELD

The present invention relates to a technique for inspecting a fine pattern in the middle of a manufacturing process of a semiconductor apparatus and a photomask.

BACKGROUND ART

As a sample to be inspected, an inspection of a semiconductor wafer will be described as one example. A process in which a pattern formed on a photomask on a semiconductor wafer is transferred by a lithographic processing and an etching processing is repeated to thereby manufacture a semiconductor apparatus. In a manufacturing process of the semiconductor apparatus, the lithographic processing, the etching processing, quality of other various processing items, and foreign substance generation largely exert an influence on a manufacturing yield of the semiconductor apparatus. Accordingly, it is of importance that a pattern on the semiconductor wafer in the manufacturing process is inspected, an abnormality or failure occurrence is detected early or preliminarily and is fed back to a manufacturing process.

As a method for inspecting defects which are present on a pattern on the semiconductor wafer, a comparison inspecting method of acquiring an image by using a apparatus to which an optical microscope or electron microscope is applied, comparing it with an image free of defects, and extracting an image having defects is used.

An inspection apparatus to which an electron microscope is applied has a resolution higher than that of an optical microscope; however, when an electron beam is irradiated onto a semiconductor wafer, a charge phenomenon depending on a pattern material of it occurs. A potential difference on a surface of the semiconductor wafer is reflected on a secondary electron emission efficiency and a potential contrast occurs. By using this, therefore, electrical defects such as conduction and non-conduction of a circuit pattern generated on a surface or in a lower layer, and a short circuit of wiring and transistors can be detected. However, since the entire image may be projected black or white, the charge amount is required to be appropriately controlled. Further, an image contrast between a defect and its surrounding is improved, and a surface potential is stabilized and brightness of the image is uniformed. For that purpose, with regard to precharge for irradiating electrons onto the semiconductor wafer before acquiring an inspection image, whether a precharge result becomes equal to a desired charge amount is required to be known.

An operator acquires an image and visually determines whether precharge conditions are appropriate. Even if a desired image is obtained by repeating the above, the operator has a defect of requiring much time until final setting of the precharge conditions. In addition, when an electron beam is irradiated onto the same portion many times, a charge state changes. Accordingly, since the operator waits for relaxation of the charge after the irradiation and then repeats the irradiation, it takes more time to set the precharge conditions. Further, in the case where one insulting film on a bottom surface or another insulating film on a sidewall of the semiconductor wafer is thick, when the precharge is performed, an image is saturated to be white. In the case of comparing and inspecting the image of this state and an image having the same state as that of the above image, a gradation difference fails to be extracted even if a defect is present, and therefore, it is determined to be free from defect. As described above, the inspection apparatus plays a role in monitoring the presence or absence of defects in a semiconductor manufacturing line; however, when the precharge is not appropriate, reliability of the inspection is lowered.

Accordingly, since it is of great importance that prior to an inspection, a charged state of a semiconductor wafer is known, various methods are proposed. For example, one method is disclosed in which a relationship between an image as a standard sample and the charge amount is previously obtained, and then the above image and the acquired image are compared to thereby estimate the charge amount (see, for example, Patent Literature 1). Further, another method is disclosed in which a relationship between a resistance value of a semiconductor wafer, a potential contrast image, and a charge voltage is obtained, and then the resistance value is measured to thereby determine the charge voltage from the potential contrast image (see, for example, Patent Literature 2). In addition, another method is disclosed in which a potential is measured by using electrodes provided on a surface of a semiconductor wafer (see, for example, Patent Literature 3). However, with regard to the method for previously obtaining a relationship between the image and the charged state, and then estimating the charge amount from the image acquired prior to an inspection, it is doubtful whether it indicates its real charged state. The reason is that the charged state delicately changes due to a difference of a shape or material of a sample and irradiation conditions of electron beam. Further, with regard to the method for measuring a potential by using the electrodes provided on a surface, since a potential of a position distant from the sample is measured, the charged state of the sample itself is not measured.

CITATION LIST

Patent Literature

Patent Literature 1: JP-A-2007-053035
Patent Literature 2: JP-A-2003-100823
Patent Literature 3: JP-A-2002-216698

SUMMARY OF INVENTION

Technical Problem

For preventing a reliability of an inspection from being lowered, a charged state of a sample surface is demanded to be accurately acquired; however, there is a problem that in a conventional method, since the charged state is merely estimated, it is difficult to affirm that reliability of the inspection is maintained.

In view of the foregoing, it is an object of the present invention to provide a pattern inspection apparatus which can simply set an optimal condition of precharge with respect to a pattern, prevent sensitivity for a defect detection from being reduced, automatically inspection whether the precharge is good or not, feed inspection results back to an operation afterward, prevent reliability of them from being reduced, and always perform a stable inspection.

Solution to Problem

To accomplish the above objects, according to one aspect of the present invention, there is provided a pattern inspection apparatus having an irradiation means which irradiates an electron beam onto a surface of a substrate on which a pattern is formed, a detection means which detects a signal generated from the substrate, an image means which images a signal detected by the detection means, a comparison means which compares both images imaged by the image means and inspections the substrate. This pattern inspection apparatus includes a charge formation means to form charge on a surface of the substrate by generating an electron beam from a second electron source which is different from an electron source which generates the electron beam before irradiating the electron beam, a current measuring means to measure a value of a current flowing in the substrate while the charge is formed on a surface of the substrate by the charge formation means, and an adjustment means to adjust the charge farmed by the charge formation means so that the value of the current measured by the current measuring means is a predetermined target value.

Advantageous Effects of Invention

The above-described configuration permits a pattern inspection apparatus to simply set an optimal condition of precharge with respect to a pattern, prevent sensitivity for a defect detection from being reduced, automatically inspection whether the precharge is good or not, feed inspection results back to an operation afterward, prevent reliability of them from being reduced, and always perform a stable inspection.

BRIEF DESCRIPTION OF DRAWINGS

FIG. 12 is a flowchart illustrating a procedure of an inspection;

FIG. 13 is a screen diagram illustrating an example of a screen display during execution of the inspection; and FIG. 14 is a screen diagram illustrating an example of the screen display during execution of the inspection.

DESCRIPTION OF EMBODIMENTS

Figure 1:
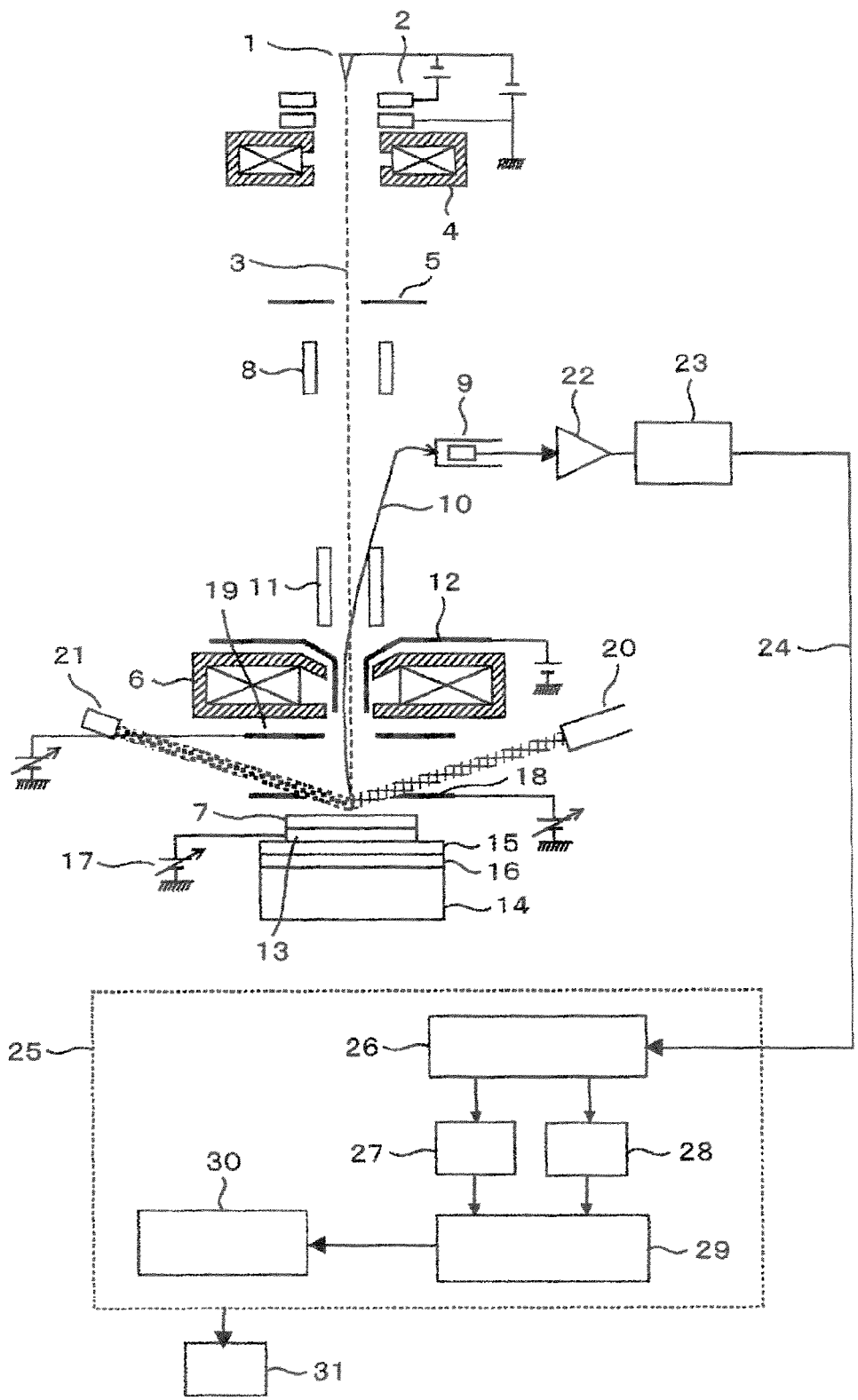
FIG. 1 is a configuration diagram illustrating a circuit pattern inspection apparatus according to the present embodiment.

Preferred embodiments of the present invention will be described below with reference to the accompanying drawings.

A pattern inspection apparatus according to the present embodiment of the invention is a circuit pattern inspection apparatus including means which irradiates an electron beam onto a surface of a substrate on which the circuit pattern is formed, means which detects a signal generated from the substrate, and means which images a signal detected by the detection means, and further includes means which forms a charge by another electron source as a preprocessing of an inspection, means which adjusts the charge amount, means which measures the charge amount, means which registers the charge adjustment amount as an inspection condition, means which compares the registration condition and the measurement charge amount, means which inspections based on the comparison whether or not the charge amount becomes equal to a desired value, and means which determines, based on the inspection results, a next processing of performing an inspection, adding a charge, doing the inspection again, or interrupting the inspection.

Further, means which adjusts the precharge amount has a function of selecting any one or two or more combinations of a stage continuous moving direction during the irradiation of electron beams, an irradiation area, a pitch and overlapping during the continuous moving irradiation, an emission current of an electron source, an irradiation time, the number of times of irradiation, a potential of an electrode over a wafer. This permits the pattern inspection apparatus to adjust the charge amount so as to have an appropriate charge in conjunction with surface materials and structure of various semiconductor wafers.

Means which measures the precharge amount has a function of selecting any one or two or more combinations of the current amount and polarity of a current (hereinafter, referred to as an absorption current) flowing in a holder through a wafer to be inspected during the precharge execution, a focused focal point condition at the time of acquiring an electron microscope after end of the precharge and taking the focus, namely, a current value of a focusing lens, and a measured value of a potential by a surface potential meter. This process permits the pattern inspection apparatus to immediately determine whether or not a potential on a surface of the semiconductor wafer becomes equal to a desired value.

According to the present embodiment of the invention, the pattern inspection apparatus can easily set an optimal condition of the precharge with respect to a pattern formed on the semiconductor wafer, and therefore improve sensitivity for a defect detection. Further, the apparatus can automatically inspection whether the precharge is good or not and feed the inspection results back to the operation afterward, and therefore improve reliability and stability of them. As a result, the apparatus can shorten a turn around time (TAT) as countermeasure for faults of the semiconductor apparatus.

In the following embodiment, a case of using the circuit pattern inspection apparatus for the semiconductor apparatus formed on the semiconductor wafer and inspecting the presence or absence of defects by using an electron beam will be described as one example. In an image obtained by irradiating an electron beam onto a sample, a problem and configuration of the apparatus which is affected by the charge are the same as those of the present embodiment.

FIG. 1 is a configuration diagram illustrating the circuit pattern inspection apparatus according to the present embodiment. Vertical cross sections of only main components are illustrated, and a vacuum vessel, a vacuum exhaust apparatus, a vacuum spare chamber provided between the vacuum vessel and an atmospheric air, a drive unit of a stage, and a control source are omitted.

An electron beam 3 lead out from an electron source 1 by lead-out electrodes 2 is converged by a condenser lens 4. The amount of electrons generated from the electron source 1 can be obtained by measuring an emission current. Further, the amount of the emission current can be controlled by adjusting a voltage of the lead-out electrodes 2.

In the electron beam 3 converged by the condenser lens 4, a surrounding random energy component is deleted by an aperture diaphragm 5. The electron beam 3 is narrowed down by an objective lens 6 and is irradiated onto a wafer 7. For the purpose of acquiring an image of the wafer 7, since a spot diameter of the electron beam 3 is small, a surface of the wafer 7 is scanned by a polarizer 8. While synchronized with this scanning, a secondary electron 10 is detected by a detector 9 for imaging. In order that the secondary electron 10 may be deviated from an orbit of the electron beam 3 and be directed in the direction of the detector 9, the polarizer 11 which fails to exert an influence on an orbit of the electron beam 3 is provided. Since the secondary electron 10 has energy smaller than that of the electron beam 3, electrodes 12 are provided near the objective lens 6 and the secondary electron 10 is lifted over the objective lens 6.

The wafer 7 is mounted on a holder 13, and is moved in the X direction by an X stage 15 on a base 14 or in the Y direction by a Y stage 16 thereon. For performing a high speed inspection, it is necessary only to increase energy of the electron beam 3; however, the wafer 7 may be destroyed. Therefore, as a countermeasure against the above-described problem, effective is a retarding method of applying a negative voltage to the wafer 7, making small a potential difference between the wafer 7 and the electron source 1, decelerating the electron beam 3 to the wafer 7, and preventing destruction. To the holder 13, a retarding voltage is applied by a retarding power supply 17, and as a result, the wafer 7 has the same potential as that of the holder 13.

Further, in order that a space with a constant potential may be formed on a surface of the wafer 7 to eliminate acceleration of the electron beam 3 within it without decelerating the electron beam 3 immediately before the wafer 7, electrodes 18 are provided. To the electrodes 18, the same voltage as that of the holder 13 is applied. For controlling a charged state of the wafer 7, electrodes 19 are provided, and further a precharge unit 20 which irradiates electrons to the wafer 7 and charging it before acquiring an image is provided.

For monitoring a change in a height of the surface of the wafer 7, a height sensor 21 is provided. Since a change in the height exerts an influence on a deviation of a focus, an excitation strength of the objective lens 6 is changed and a focal length is adjusted so as to bring into focus a height of the surface of the wafer 7 measured by the height sensor 21.

When the detector 9 detects the secondary electron 10, an electric signal generated by the detection of the secondary electron is amplified by a preamplifier 22, converted by an AD converter 23 from an analog signal to a digital signal, and transmitted to an image processing unit 25 through a transmission path 24 of a fiber-optic cable.

One image is generated by a delay buffer memory 26 within the image processing unit 25, and is read into a first image memory 27, and at the same time, a next image is read into a second image memory 28. A comparison calculator 29 compares one image read into the first image memory 27 and another image read into the second image memory 28, and calculates a size difference between their signals. A difference image including only difference signals obtained by the calculation is supplied to a defect inspecting unit 30, and a pixel signal size of which exceeds a predetermined threshold is inspected to have a defect coordinate. A pattern image or difference image can be displayed on an image display unit 31.

Figure 2:
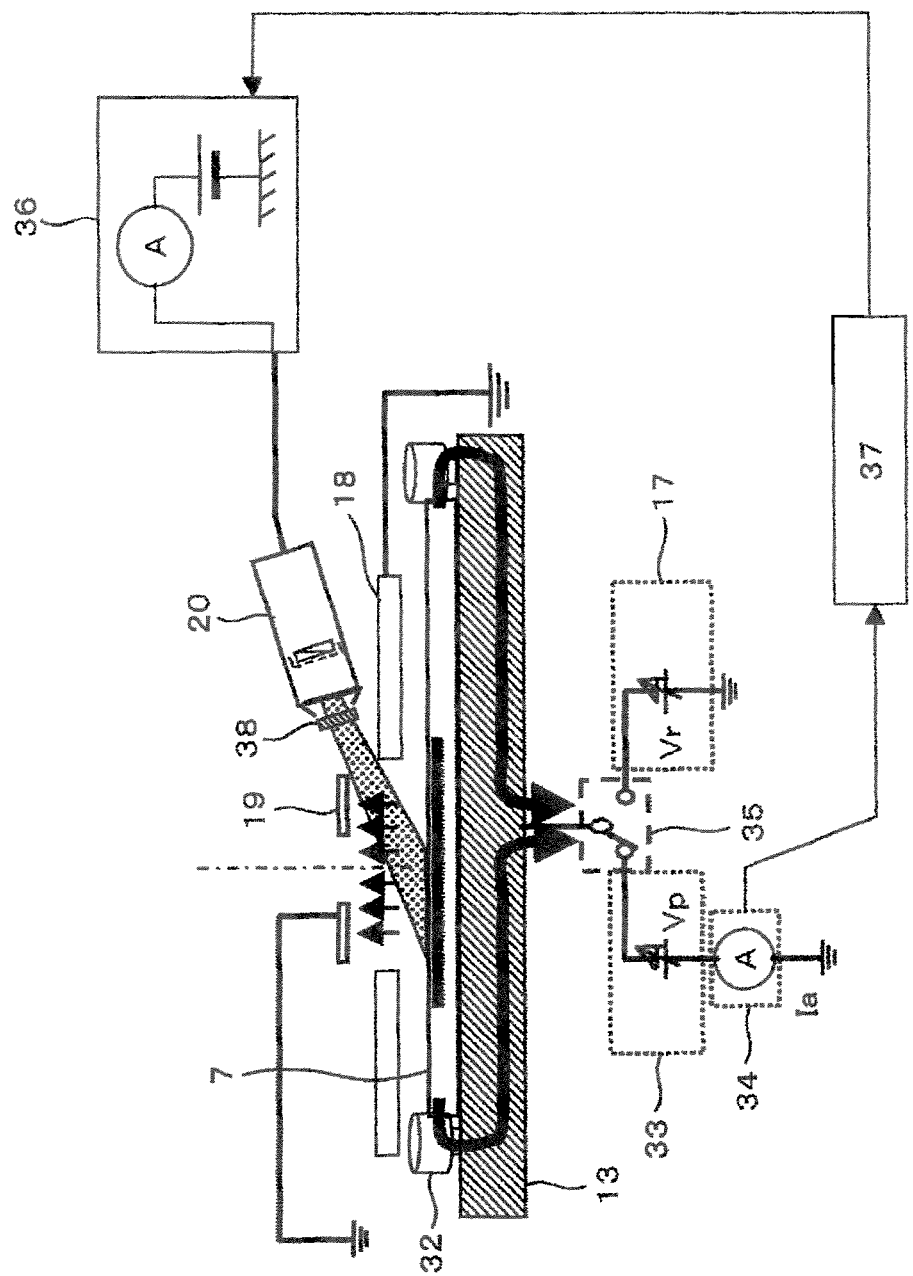
FIG. 2 is a configuration diagram in which a portion of a holder illustrated in FIG. 1 is enlarged.

FIG. 2 is a configuration diagram in which a portion of the holder 13 illustrated in FIG. 1 is enlarged. The wafer 7 is mounted on the holder 13, and is fixed by pins 32 so as not to be moved. Note that an electrostatic chuck which fixes the wafer 7 may be used in place of the holder 13 without using the pins 32. Since a voltage is supplied to the wafer 7 from a retarding power supply 17 through the holder 13, a current flows therein. In the present embodiment of the invention, the pattern inspection apparatus is further configured so that a voltage is supplied from a precharge power supply 33. To the precharge power supply 33, an ammeter 34 is connected and measures a current flowing in the holder 13. The precharge power supply 33 and the retarding power supply 17 are switched by a switching unit 35. Over the wafer 7, the electrodes 18 and 19 are disposed, and a charge polarity on a surface of the wafer 7 can be controlled depending on a relationship between one voltage applied to the holder 13 and another voltage applied to the electrodes 18 and 19. Electrons irradiated onto the wafer 7 flow in the holder 13 from a bottom surface of the wafer 7, or through a member contacting with a side surface thereof, namely, the pins 32 in the present embodiment. A current generated by irradiated electrons which flows in the holder 13 can be measured by the ammeter 34. During the inspection, a retarding voltage is applied from the retarding power supply 17 to the wafer 7. However, in the case where the precharge is required before the inspection, the retarding power supply 17 is switched over to the precharge power supply 33 by the switching unit 35, and a voltage of an optional value is supplied to the wafer 7.

To the precharge unit 20, a precharge unit power supply 36 is connected and can control the amount of electrons irradiated from the precharge unit 20. According to a current value measured by the ammeter 34, a controller 37 controls a voltage supplied to the precharge unit 20 from the precharge unit power supply 36. A shutter 38 is provided on the precharge unit 20, and even if a voltage supplied from the precharge unit power supply 36 is not equal to zero, it can prevent electrons from being irradiated from the precharge unit 20. The shutter 38 has, for example, a structure in which an opening for causing electrons to pass through itself is provided on a disk, and can cause the disk to be rotated and electrons to pass through it or to be cut off.

Figure 3:
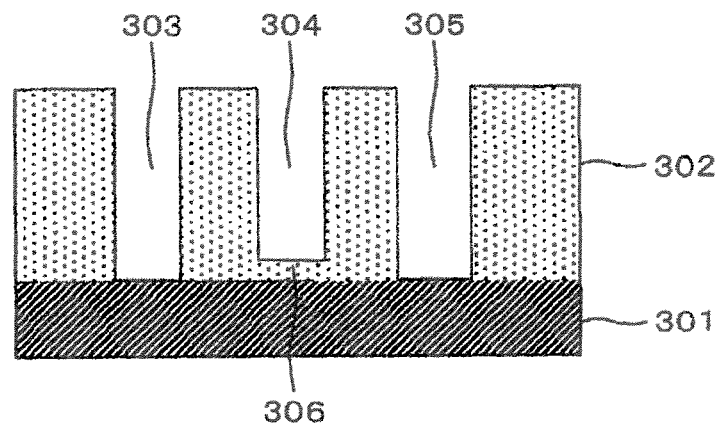
FIG. 3 is a vertical cross sectional view of one portion of a semiconductor wafer to be inspected.
Figure 4:
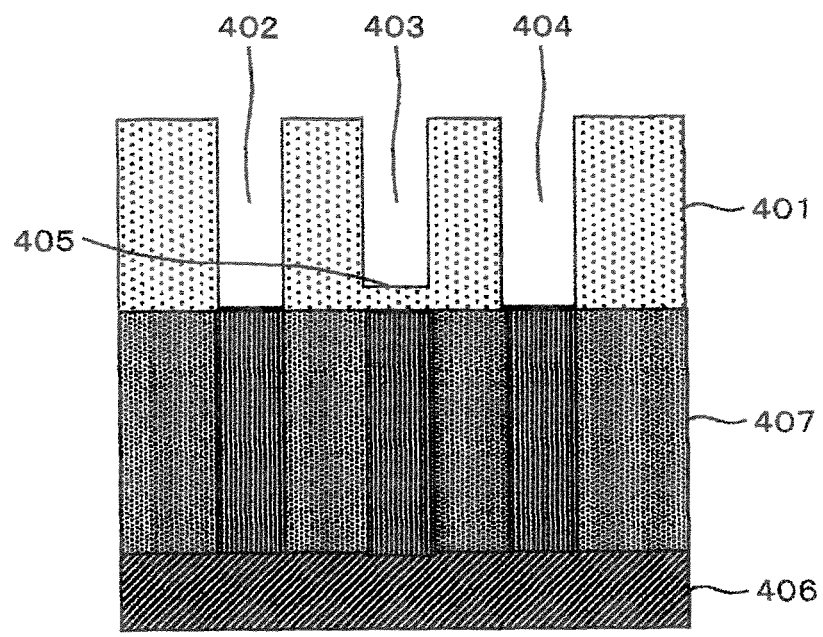
FIG. 4 is a vertical cross sectional view of one portion of the semiconductor wafer to be inspected.

FIGS. 3 and 4 are vertical cross sectional views of one portion of the semiconductor wafer to be inspected. FIG. 3 illustrates an example in which an opening failure 306 that a bottom surface of a contact hole 304 fails to reach a silicon substrate 301 occurs in a manufacturing process in which a plurality of contact holes 303, 304, and 305 are opened by etching in an insulating material film 302 formed on the silicon substrate 301. FIG. 4 illustrates an example in which an opening fails to reach a conducting material plug 407 formed on a silicon substrate 406 due to an opening failure 405 of a contact hole 403 among a plurality of contact holes 402, 403, and 404 opened in an insulating material film 401 in the same manner as in FIG. 3.

Figure 5:
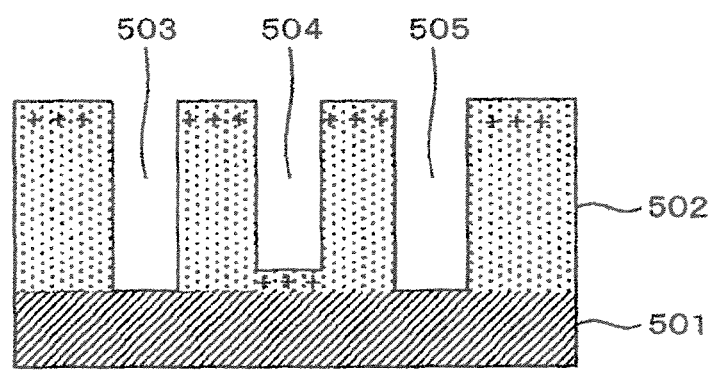
FIG. 5 is a vertical cross sectional view of one portion of the semiconductor wafer to be inspected, and a screen diagram illustrating an image obtained by imaging the one portion.
Figure 5:
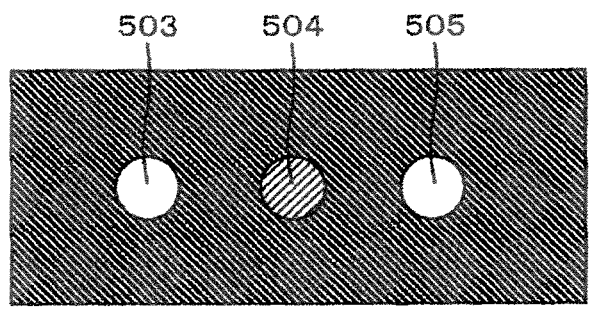
Figure 6:
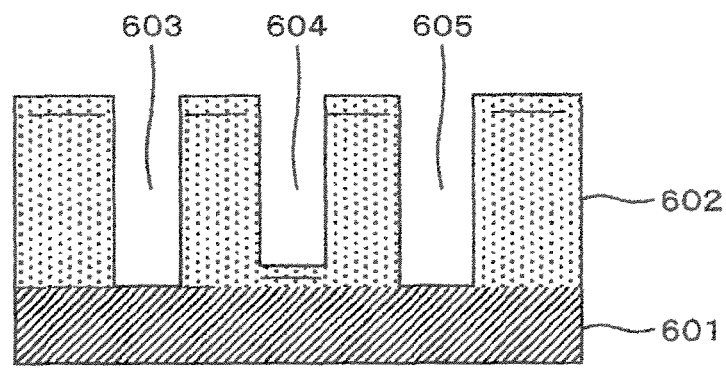
FIG. 6 is a vertical cross sectional view of one portion of the semiconductor wafer to be inspected, and a screen diagram illustrating an image obtained by imaging the one portion.
Figure 6:
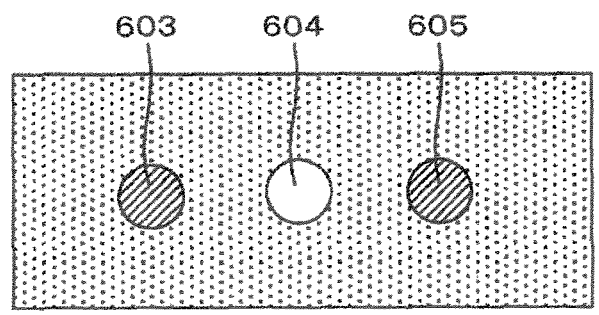

FIG. 5 is a vertical cross sectional diagram of one portion of the semiconductor wafer to be inspected, and FIG. 6 is a screen diagram illustrating an image obtained by imaging the one portion. In the case where in FIG. 5A, an insulating material film remains on a bottom surface of a contact hole 504 among a plurality of contact holes 503, 504, and 505 opened in an insulating material film 502 formed on a silicon substrate 501, when positively charged by a factor of some sort, a film surface of positively charged insulating materials is projected black, the contact holes 503 and 505 are projected white, and the contact hole 504 in which a bottom surface is positively charged is projected black in the electron beam image illustrated in FIG. 5B. Accordingly, an opening failure of the contact hole can be understood by the electron beam image. Further, when the image of an opening failure is compared with a normal image, since a difference in the light intensity is present between a portion of an opening failure and normal portion of the contact hole, the contact hole of an opening failure can be extracted as a defect. FIG. 6A illustrates a case where a contact hole has an opening failure of the same structure as in FIG. 5A, and its bottom surface is negatively charged. Accordingly, in the electron beam image illustrated in FIG. 6B, since a surface of an insulating material film 602 is negatively charged, it is projected white. Contact holes 603 and 605 which are opened and conductive to a silicon substrate 601 are projected black, and since a bottom surface of an opening failure is negatively charged, a contact hole 604 is projected white. Accordingly, an opening failure of the contact hole can be understood by the electron beam image. Further, when the image of an opening failure is compared with the normal image, since a difference in the light intensity is present between a portion of an opening failure and normal portion of the contact hole, the contact hole of an opening failure can be extracted as a defect.

Returning to FIG. 2, a diameter on the wafer 7 of an electron flux irradiated from the precharge unit 20 is from several millimeters to several tens of millimeters. The charge amount of the wafer 7 by the precharge unit 20 can be adjusted by using at least one or two or more combinations of the following parameters: (1) an electron source emission current of the precharge unit 20, (2) a lead-out voltage at a time when an electron of the precharge unit 20 is led out, (3) a potential of the electrodes 18 provided over the wafer 7, (4) an irradiated area, (5) a stage moving speed and direction during the precharge, (6) a pitch during the reciprocal irradiation, and (7) the number of times of irradiation.

The electron source emission current is a parameter for adjusting the amount of electrons irradiated onto the wafer 7. A plurality of reference emission currents are previously set as an initial value like high, middle, and low. When using the reference emission current, an operator starts from it so that it is changed to obtain a desired current. When selecting conditions for a desired stage from a screen, a user can set a corresponding reference emission current. A lead-out voltage of the precharge unit 20 is set to a value determined by the controller 37. When a polarity of the electrodes 18 provided over the wafer 7 is switched over, whether a surface of the wafer 7 is charged positively or negatively can be switched over. Further, a potential of this electrodes 18 can control the amount of electrons and polarity secondarily generated from electrons irradiated for precharge, and therefore, adjust the amount of the absorption current flowing in the holder 13. The above-described electron source emission current, lead-out voltage, and polarity of the electrodes 18 of the precharge unit 20 are parameters for adjusting the amount of the absorption current flowing in the holder 13 during the precharge.

Figure 7:
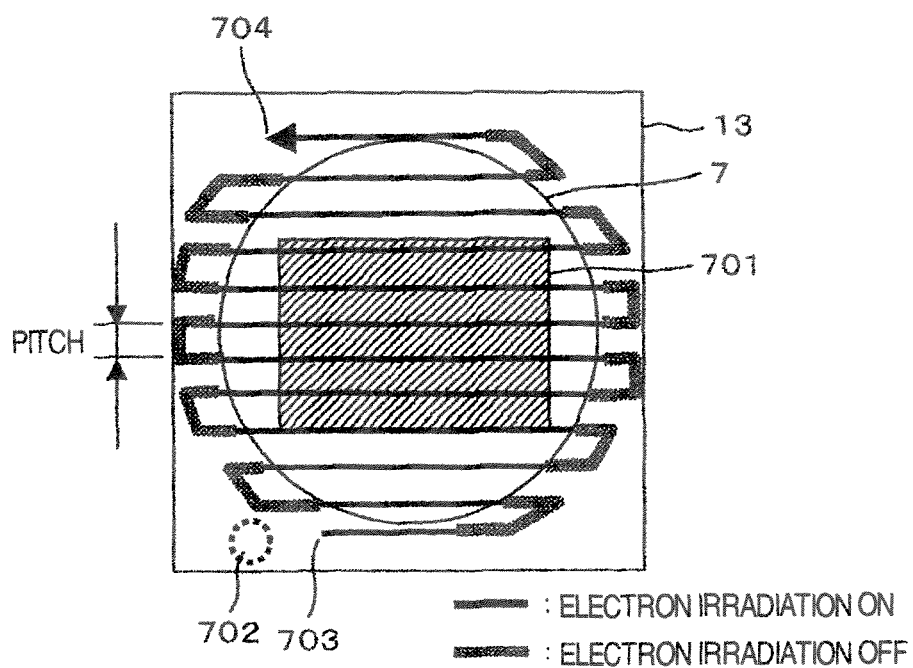
FIG. 7 is a plan view of a wafer mounted on the holder.
Figure 8:
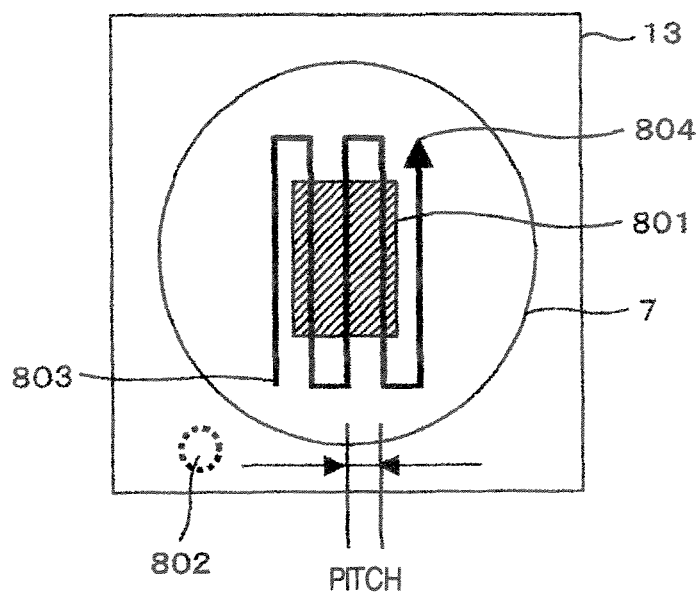
FIG. 8 is a plan view of the wafer mounted on the holder.

FIGS. 7 and 8 are plan views of the wafer 7 mounted on the holder 13, and illustrate an irradiation procedure of the precharge. FIG. 7 illustrates the irradiation procedure in the case where the entire surface of the wafer 7 is precharged with respect to an area to be inspected 701, and FIG. 8 illustrates the irradiation procedure in the case where only an area somewhat larger than an area to be inspected 801 is precharged. The operator can select whether the same direction as a moving direction of a stage for acquiring an inspection image is used, or a direction perpendicular to the moving direction is used as a direction to be irradiated by using the precharge unit 20 in FIGS. 7 and 8. In an example illustrated in FIG. 8, for example, when an orbit illustrated in full line of the precharge is folded down, since the moving direction of the stage is changed to a perpendicular direction, the precharge is stopped once. Accordingly, electrons for the precharge are irradiated onto the portion more than that in which the stage is continuously moved. As a countermeasure against the above-described problem, the precharge is performed in the direction perpendicular to the moving direction of the stage during the inspection, unevenness of charge in the folding portion can be prevented from exerting an influence on the acquired image during the inspection.

A procedure of the precharge is performed as follows. Suppose that in FIG. 7, a horizontal direction is an X direction and a direction from this side of a paper surface to a paper surface depth side is a Y direction. First, a condition setting unit 702 provided on the holder 13 is irradiated with electrons by the precharge unit 20 as long as a fixed time, and a current value is confirmed. Further, in a given area on the wafer 7, when the moving speed of the stage is fast, the amount of irradiated electrons is small, whereas when it is slow, the amount of irradiated electrons is large. As a result, since the charge amount changes, the moving speed in the X direction of the stage is previously set. Next, the stage is caused to reciprocate from a starting point 703 to an ending point 704 in the X direction illustrated in FIG. 7, and electrons are irradiated onto the wafer 7. In a portion indicated by a thick line in FIG. 7, the wafer 7 is absent, and either one method for stopping irradiation of electrons or another method for not stopping irradiation of electrons can be selected. When using as a reference a diameter of an electron flux irradiated from the precharge unit 20, when a pitch in the Y direction of reciprocating of the precharge is large, the electron density is reduced, whereas when it is small, the electron density is raised, and therefore, the charge amount can be controlled. In FIG. 7, an example in which electrons are irradiated once from the starting point 703 to the ending point 704 is illustrated. Further, when reaching the ending point 704, electrons may be irradiated again from the ending point 704 to the starting point 703. Alternatively, the stage may be moved from the ending point 704 to the starting point 703, and electrons may be irradiated again from the starting point 703 to the ending point 704 to thereby increase the amount of irradiated electrons. Alternatively, the above-described follow-up irradiation may be repeated more than once to further increase the amount of irradiated electrons.

FIG. 8 illustrates a case where electrons are irradiated onto only an area somewhat wider than an area to be inspected 801. In the case where the area to be inspected 801 is extremely smaller than an area of the wafer 7, since electrons can be prevented from being irradiated onto an area in which no influence is exerted on an inspection image, the above-described method is effective in saving a time. In FIG. 8, by the precharge unit 20, electrons are first irradiated onto a condition setting unit 802 provided on the holder 13 as long as a fixed time, and a current value is confirmed. Further, in a given area on the wafer 7, when the moving speed of the stage is fast, the amount of irradiated electrons is small, whereas when it is slow, the amount of irradiated electrons is large. As a result, since the charge amount changes, the moving speed in the X direction of the stage is previously set. Next, the stage is caused to reciprocate from a starting point 803 to an ending point 804, for example, in the Y direction illustrated in FIG. 8, and electrons are irradiated onto the wafer 7. When using as a reference a diameter of an electron flux irradiated from the precharge unit 20, when a pitch in the X direction of reciprocating of the precharge is large, the electron density is reduced, whereas when it is small, the electron density is raised, and therefore, the charge amount can be controlled. In FIG. 8, an example in which electrons are irradiated once from the starting point 803 to the ending point 804 is illustrated. Further, when reaching the ending point 804, electrons may be irradiated again from the ending point 804 to the starting point 803. Alternatively, the stage may be moved from the ending point 804 to the starting point 803, and electrons may be irradiated again from the starting point 803 to the ending point 804 to thereby increase the amount of irradiated electrons. Alternatively, the above-described follow-up irradiation may be repeated more than once to further increase the amount of irradiated electrons.

Figure 9:
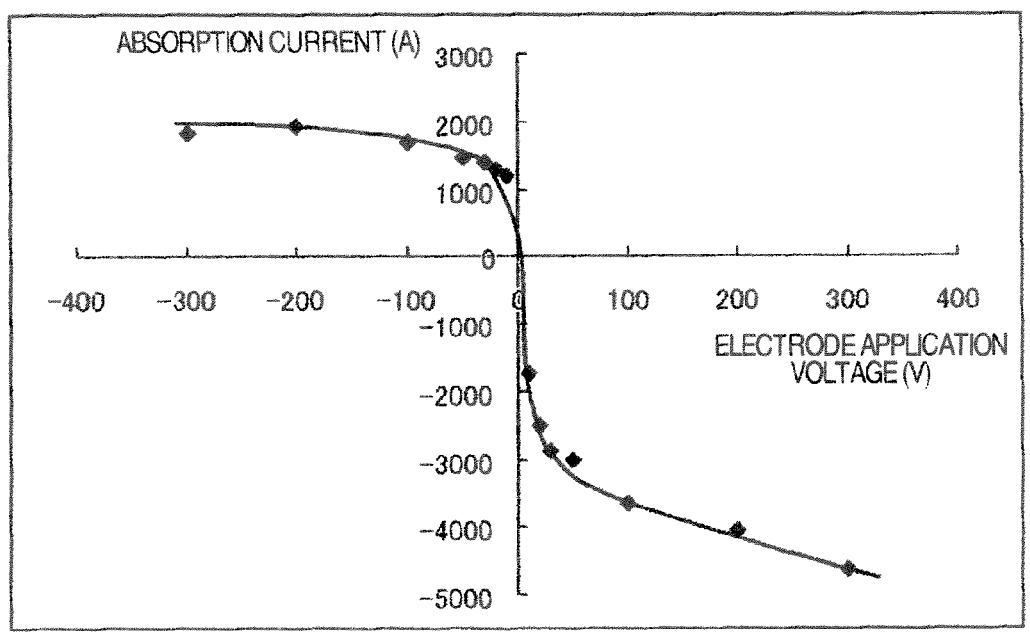
FIG. 9 is a graph illustrating a characteristic of an absorption current.

FIG. 9 is a graph illustrating a characteristic of the absorption current. As one parameter for determining whether the charge amount is a desired amount or not, the amount of absorption current flowing in the holder 13 during the precharge is used. Depending on a polarity of the absorption current, whether the wafer 7 is charged positively or negatively by the precharge can be determined. For example, when the current amount is a positive value, the wafer 7 is positively charged, whereas when it is a negative value, the wafer 7 is negatively charged. When the absorption current has the same polarity and its absolute value is large, a stronger charge is formed.

Before inspecting the wafer 7 and setting inspection conditions, a relationship between the emission current amount of electron source of the precharge unit 20, a voltage of the electrodes provided over the wafer 7, and the absorption current amount including the polarity at the time of performing the precharge under respective conditions can be previously obtained, and it can be registered as the apparatus characteristic parameter. FIG. 9 illustrates one example of the above. At this time, over a silicon bare wafer or the holder 13, the absorption current is measured by using as a parameter a voltage applied to the electrodes. While less affected by one contact resistance caused by the wafer 7 and the holder 13, or another contact resistance caused by the wafer 7 and the pins 32, a characteristic of the absorption current can be obtained. When this characteristic is stored, and an emission current and a voltage applied to the electrodes are input during the precharge before the inspection, a target value of the absorption current is automatically calculated. When the emission current and the voltage applied to the electrodes are adjusted so that the measurement value is this target value of the absorption current, a desired charge state including positive charge and negative charge can be formed over a surface of the wafer 7.

In the wafer 7 in the middle of the semiconductor manufacturing process, an insulating film may be attached to side surfaces or bottom surface of the wafer 7. When contacting with the holder 13 through the insulating film, the wafer 7 is in a floating state, and it may fail to be subjected to the desired charge at the time of performing the precharge. Whether or not the wafer 7 is good can be determined from deviation between the absorption current characteristics previously measured as illustrated in FIG. 9 and the absorption current amount at the time of performing the precharge. The absorption current required for forming the desired charge amount is automatically calculated before inspecting the wafer 7, and is displayed on a screen of the image display unit 31. Therefore, the emission current and potential applied to the electrodes of the precharge unit 20 are set so that the measurement value is a target value of the above-described absorption current. The stage speed and the number of times of the precharge are further set, if necessary. Since a tolerance is different depending on products or processes, an allowed value for setting the absorption current in a process wafer is calculated so that the tolerance can be set to recipe parameters. For example, when considering an average deviation in the process wafer, a margin of error of plus or minus 10% is considered to the target value. Since the absorption current is normally hard to flow in a process wafer as compared with respect to the target value, only a minus deviation to the target value may be managed, or a size of the allowed value may be changed on the plus side and the minus side. In the case where the absorption current outside the tolerance is processed, its process content may be previously selected and set. When the inspection is performed and the absorption current is smaller than the tolerance: for example, (1) the precharge is added, (2) a voltage applied to the upper electrodes of the wafer 7 or the holder 13 is changed and the precharge is added, (3) the wafer 7 is unloaded once, and reloaded to perform the precharge again, (4) after electrons are irradiated so as to have a polarity opposite to that in precharge conditions, the wafer 7 is unloaded once, and reloaded to perform the precharge again, and (5) even if the above-described processings of (1) to (4) are performed, when the absorption current is outside the tolerance, a preparation is performed so as to select any of processings such as an inspection interruption. Here, irradiating electrons is called as a discharge so as to have a polarity opposite to that of the precharge conditions (4).

Figure 10:
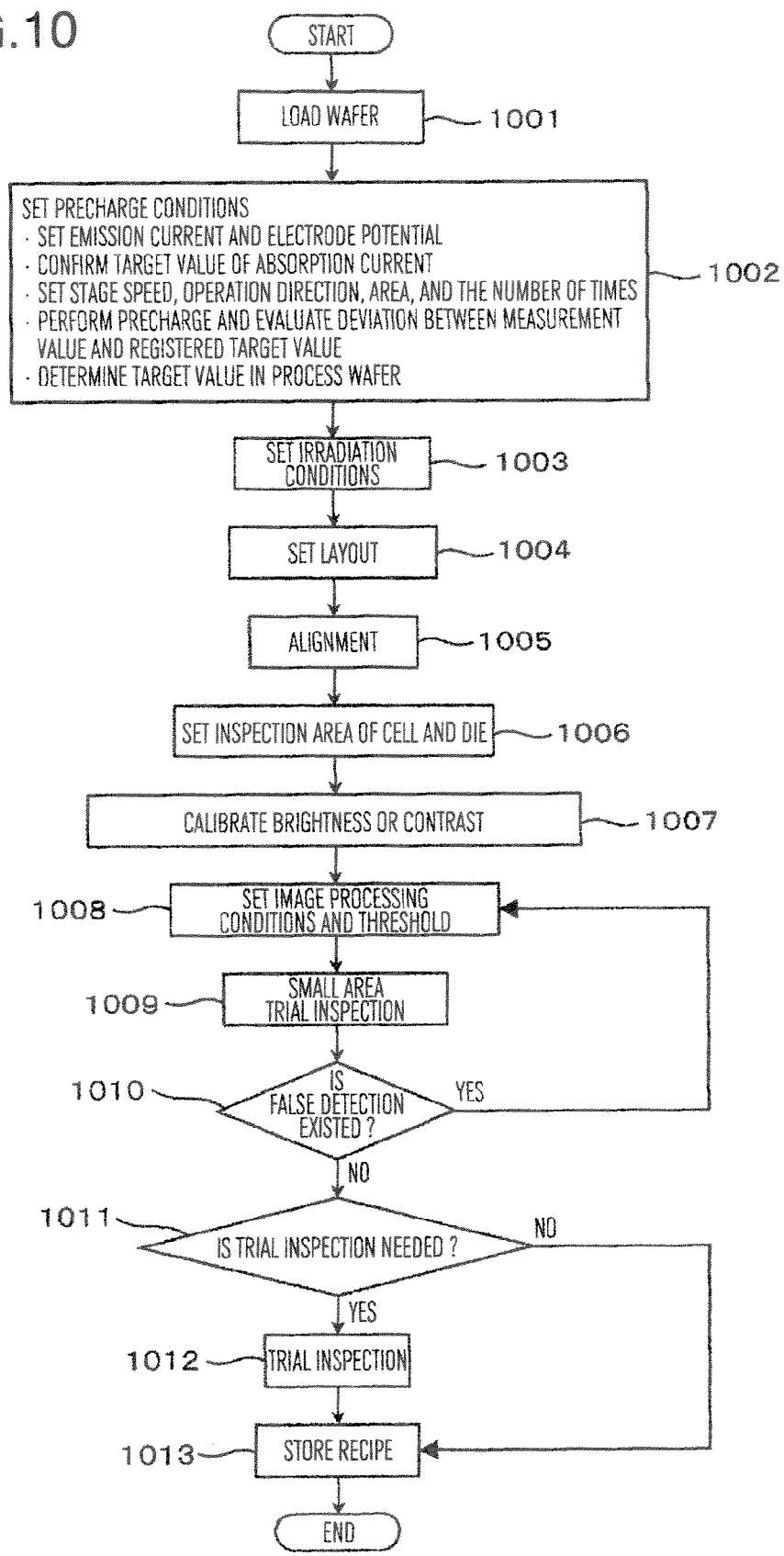
FIG. 10 is a flowchart illustrating a procedure for setting an inspection recipe into which a precharge condition setting is incorporated.
Figure 11:
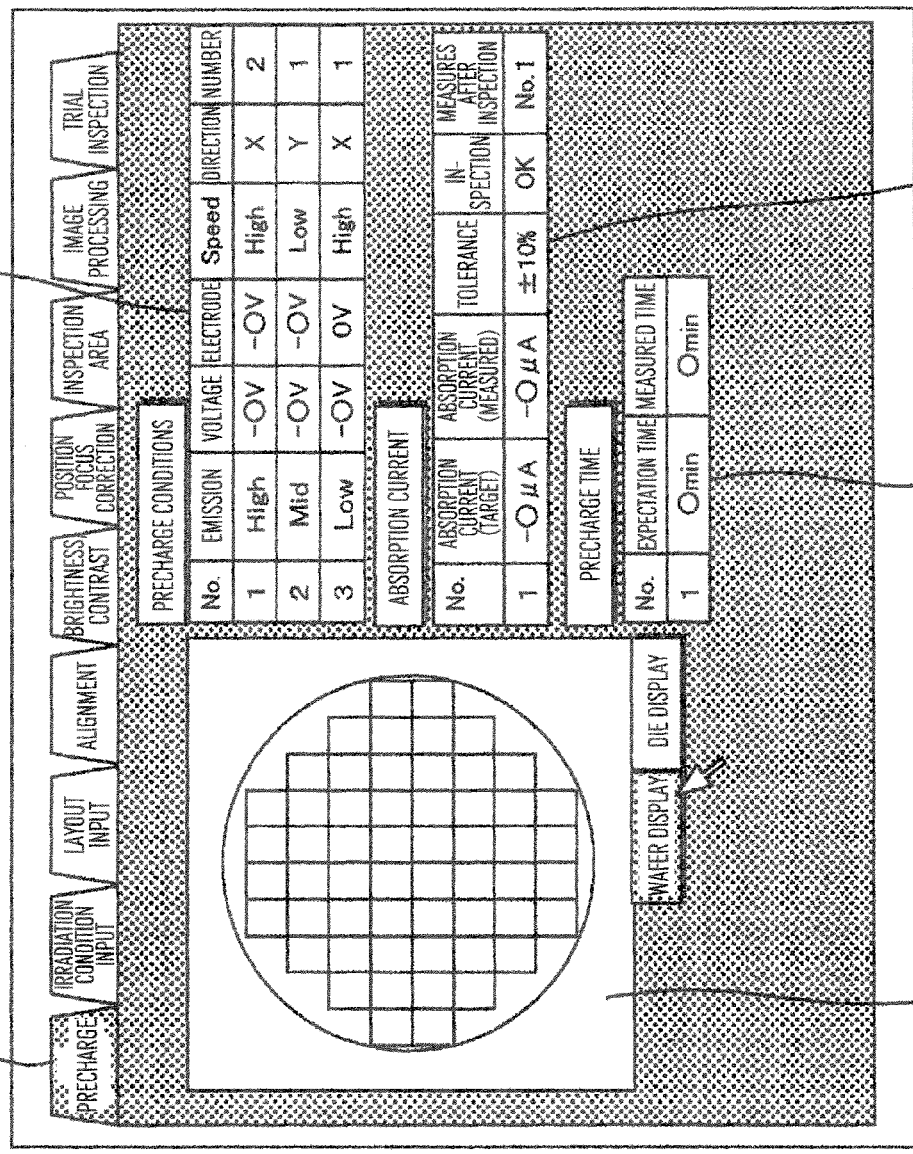
FIG. 11 is a screen diagram illustrating one example of a screen for setting precharge conditions.

FIG. 10 is a flowchart illustrating a procedure for setting an inspection recipe into which a precharge condition setting is incorporated. Further, FIG. 11 is a screen diagram illustrating one example of a screen for setting the precharge conditions. On a screen of the image display unit 31 illustrated in FIG. 1, an image illustrated in FIG. 11 is displayed. The screen is displayed in a tab format, and FIG. 11 illustrates a setting screen of the precharge as illustrated in a tab 1101. In an area of the left side of the screen, a wafer map 1102 is displayed, and in an area of the right side of the screen, a setting area 1103 of the precharge conditions, a display area 1104 of the absorption current, and a display area 1105 of an expectation time of the precharge are displayed.

In FIG. 10, the wafer 7 to be inspected is loaded on a circuit pattern inspection apparatus (Step 1001), and the precharge conditions are set (Step 1002). Depending on contents of the manufacturing processes of the wafer 7 to be inspected, whether the precharge is present or absent, and the inspection conditions are positive charge or negative charge are previously determined. For example, in a contact hole in an initial stage of the process of memory products, a pattern density is high and a hole diameter is small, and a silicon nitride film is formed on an outermost surface in many cases. In the above-described wafer, the precharge of the negative charge is performed as illustrated in FIG. 6 and the inspection is performed under conditions of the negative charge.

In a recipe preparation, for example, the inspection is set under conditions that the absorption current of about negative several microamperes flows. In the setting area 1103 of the precharge conditions illustrated in FIG. 11, an operator selects conditions thought to be appropriate from among three predetermined emission current values of the precharge unit 20, sets a voltage applied to the precharge unit 20, and sets a potential value applied to the electrodes 19 provided over the wafer 7 so that the measurement value is the above-described absorption current value. Then, from a characteristic graph of the absorption current previously registered in the apparatus as illustrated in FIG. 9, a target value of the absorption current is calculated and displayed on the display area 1104 of the absorption current. The operator selects the tolerance and measures after the inspection. As the measures after the inspection, when the absorption current is outside the set tolerance, for example, the operator unloads the wafer 7 and reloads it so as to perform the precharge. Even if the operator continues the above three times, when the absorption current is outside the tolerance, it is considered that an error is displayed and the process is ended.

Next, in the setting area 1103 of the precharge conditions, for example, the operator sets whether the stage speed is high speed or low speed, the precharge direction is oriented in the X direction or Y direction, and the precharge is performed only once or more than once. The number of times of the precharge can be set to once to the arbitrary number of times. A voltage applied to the wafer 7 from the precharge power supply 33 during the precharge is set to a fixed value in the present embodiment; however, when the voltage can be specified, a specification area may be provided on the screen illustrated in FIG. 11.

When an input of the conditions is completed, an expectation time required for the precharge is displayed on the display area 1105 of the expectation time for the precharge. After confirming this time, when the operator pushes a start button, the precharge is started. When the precharge is started, an actual measurement value of the absorption current flowing in the holder 13 at the time of irradiating electrons onto the wafer 7 is displayed on the display area 1104 of the absorption current. The operator confirms the displayed actual measurement value of the absorption current, and inputs an inspection of whether the precharge conditions are OK. If not, the contents of the set measures after the inspection are performed.

When the precharge conditions are determined, the inspection conditions are then set, and confirmed by a trial inspection. Further, both the conditions are stored, when determined, in a storage apparatus (not illustrated) as an inspection recipe. In the inspection conditions, the irradiation conditions are first set (Step 1003). As the irradiation conditions, for example, the irradiation energy and beam current of the electron beam 3, the voltage applied to the electrodes 18, the scanning speed, the moving speed of the stage, and the number of times of signal integration for image generation are selected or set. A focus of the electron beam 3 may be deviated up and down from a surface of the wafer 7 by the precharge. Accordingly, a height of the wafer 7 is measured by the height sensor 21. At the same time, after performing the precharge, the conditions of the lens in which the focus is changed are recorded while acquiring images through irradiation of the electron beam 3. Further, a correction value is obtained and stored based on a deviation between a focusing position and a measurement value by the height sensor 21. This process permits the focus deviation due to the precharge to be corrected.

Next, an identification code of layout data for the circuit pattern of the wafer 7 is set (Step 1004). This layout data is set with regard to new products, and when product data of the same layout is already set, if the product data is selected, the layout data is set so as to be automatically called out.

Next, before setting the inspection area of the wafer 7, for the purpose of determining the origin of coordinates, an image of an alignment mark for the wafer 7 is acquired, and an alignment is performed (Step 1005). Then, the inspection area is set (Step 1006). In the circuit pattern formed on the wafer 7, a die as a unit of a repetitive graphic for a large area, and a cell as a unit of a repetitive graphic for a small area and included in the die are used. About each of the repetitive graphics, an area to be inspected is set on a screen by using a known method so that both of them can be compared and inspected.

Next, a calibration of brightness or contrast in an image is performed (Step 1007). The calibration is performed while supplying the image to the image processing unit 25 illustrated in FIG. 1 and viewing an adjustment screen (not illustrated). Then, set is image processing conditions such as an alignment during comparison of the images and correction of a signal gradation value, and a threshold at the time of inspecting a defect from a difference between signals (Step 1008). Next, the trial inspection of a small area for acquiring an image with a small area in the area to be inspected of the wafer 7 and performing the compare inspection is performed under the set conditions (Step 1009). The trial inspection of a small area is performed by using the number of images capable of acquiring several areas near an edge of the wafer 7 or near the center of the area to be inspected in about several minutes. Further, whether the set conditions are largely deviated from desired results is confirmed. In the trial inspection of a small area, the operator confirms whether or not an image corresponding to coordinates determined to be a defect has a defect (Step 1010). If a false detection of the defect is performed, the process returns to step 1008 and conditions are reset to detect a defect again. If the false detection of the defect is not performed, whether or not the trial inspection of the area to be inspected is performed is determined (Step 1011), the trial inspection is performed (Step 1012), and the set inspection recipe is preserved (Step 1013). Even if the trial inspection is not performed, when it is enough just to perform the trial inspection of a small area, the set inspection recipe is preserved at step 1013.

FIG. 12 is a flowchart illustrating a procedure of the inspection, and FIGS. 1 and 14 are screen diagrams illustrating examples of the screen display during the execution of the inspection. During the execution of the inspection, a value of the absorption current may be different even in the wafer of the same specifications. Here, for the purpose of simplifying the description, a procedure for inspecting three pieces of wafers will be described as an example. In the inspection, the inspection recipe is first read out and the inspection conditions are input. As contents to be newly input, a specification of a slot within a storage cassette or hoop of the wafer, a lot number of the wafer, and a number of the wafer, if necessary, a comment are included. As the contents to be selected or transcribed from those previously input and displayed, a product name, a process name or identification code, and a recipe name or identification code are included. Further, the set area to be inspected is confirmed, and changed, if necessary. Further, a confirmation and change of instructions on the image storage contents are performed so as to review an output content of inspection results, namely, a confirmation and change of items of output data, and detection images.

When finishing a confirmation or instruction of the inspection conditions, the operator instructs a start of the inspection (Step 1201), and loads a first piece of wafer (Step 1202). Then, the precharge is performed under the set conditions of the inspection recipe (Step 1203), and a precharge state is displayed on a screen as illustrated in FIG. 13.

In an upper area 1301 of a screen illustrated in FIG. 13, a process during the inspection is distinguished from the other processes and is displayed. FIG. 13 illustrates an example in which a precharge process is displayed being distinguished by color coding from the other processes. In a wafer map 1302 displayed on the left side of the screen, it is displayed in full line that the entire wafer is moved in the horizontal direction, namely, the stage is moved in the X direction to be precharged. In an absorption current display area 1303 during the precharge, an actual measurement value '–Δ microamperes' is displayed. When the absorption current is included in the tolerance '±10%' of the target value '–○ microamperes', 'OK' is displayed in the inspection item, and is specified by using a click of a mouse pointer for confirmation (Step 1204). Leading to a procedure of a beam calibration of measures 'No. 1' after the inspection, focusing of the electron beam 3 is performed (Step 1205). Next, an alignment for determining the origin of coordinates of the wafer 7 is performed (Step 1206), and an adjustment of brightness or contrast in an image is performed (Step 1207). Whether the adjustment value is included in the range of an allowed value set in the inspection recipe is inspected (Step 1208), and if yes, a comparison inspection is performed (Step 1209). When the specified inspection in the inspection area is ended, inspection results are output, and at the same time, the inspection image and the images before the comparison inspection are stored (Step 1210). Further, the image corresponding to the coordinates inspected to be a defect is displayed on the image display unit 31, and whether or not its defect is a true defect can also be reviewed. As described above, the inspection of the first piece of the wafer is ended, and it is unloaded (Step 1211).

Continuously, a second piece of wafer is loaded (Step 202). The precharge is performed under the same conditions as those of the first piece of the wafer (Step 1203). As illustrated in FIG. 14, an actual measurement result of the absorption current during the precharge is '–☐ microamperes'. Since it exceeds the allowed value '±10%' of the target value '–○ microamperes', and is approximately equal to zero, the inspection at step 1204 is 'NG'. After the wafer is unloaded, the process returns to the inspection start instruction at step 1202, and the processes of steps 1202 and 1203 are performed. Again, the absorption current during the precharge is measured. Although the illustration is omitted, since its result is included in the allowed value '±10%' of the target value '–○ microamperes', the inspection at step 1204 is 'OK'. At step 1205 or later, the inspection is performed in the same manner as in the first piece of the wafer.

In the inspection at step 1204, the process returns to step 1201 up to twice. For example, when description will be made by using a third piece of wafer, it is first loaded (Step 1202), and the precharge is performed under the same conditions as those of the first piece of the wafer (Step 1203). Since the actual measurement result of the absorption current during the precharge exceeds the allowed value, it is unloaded (Step 1204). It is reloaded (Step 1202), and the precharge is performed (Step 1203) to measure the absorption current. Since the actual measurement result exceeds the allowed value, a second unload is performed (Step 1204). It is reloaded (Step 1202), and the precharge is performed (Step 1203) to measure the absorption current. Since the actual measurement result exceeds the allowed value, a third unload is performed. Therefore, the process fails to return to step 1201, it is unloaded at step 1211, and the process ends without being inspected. At this time, an error message for delivering that the precharge fails to be normally ended is displayed on an operation screen.

From the precharge conditions of the inspection recipe set by the above-described procedure, different conditions may be effective. In the wafer to be inspected in which negative charge is formed and the inspection is performed, for example, it may be feared that it is previously affected by charge by another apparatus. In such a case, the wafer is loaded and precharged under conditions that the polarity is positive charge and the absorption current is relatively small. Then, the wafer is adjusted so that the polarity is negative charge and the measurement value is a desired absorption current value.

In another embodiment, when negative charge is formed in the wafer to be inspected in which density of the contact hole is relatively low, it is precharged under conditions that the polarity is negative charge and the absorption current is large. Then, when the wafer is precharged under conditions that the polarity is the same and the absorption current is relatively small, there can be exerted an effect of suppressing excessive charge of a surface insulating film and obtaining a stable and preferable contrast.

Further, in another present embodiment, the following aspect can also be taken.

A pattern inspection method for generating an image from a secondary signal generated by irradiating an electron beam onto a surface of a substrate on which a pattern is formed, and extracting defect coordinates of the pattern by comparing and calculating both the images, includes providing a precharge unit for irradiating an electron prior to irradiation of the electron beam onto the substrate; setting at least one of an emission current of the precharge unit, a voltage applied to electrodes provided over the substrate, a voltage applied to the substrate, a moving speed of the substrate, and the number of times of the electron irradiation; moving the substrate continuously during irradiation of electrons by the precharge unit; supplying a voltage to the substrate from a first power supply; measuring a current value at the time of supplying a voltage to the substrate; and determining a value of an emission current and supplying it to the precharge unit based on the measured current value.

In the above-described pattern inspection method, when the measured current value exceeds a predetermined threshold, the substrate is unloaded and reloaded, and irradiation of electrons by the precharge unit is performed again.

The above-described pattern inspection method for supplying a retarding voltage for decelerating the electron beam to the substrate from a second power supply, switching over to the first power supply and supplying a voltage to the substrate when electrons are irradiated onto the substrate by the precharge unit, switching over to the second power supply and supplying a voltage to the substrate when the substrate is irradiated with the electron beam and an image is acquired, includes switching a polarity of a voltage applied to electrodes provided over the substrate.

According to the above-described embodiment of the invention, when the amount of irradiated electrons is adjusted by the emission current and the electrode potential, and the irradiation time is adjusted by the stage speed and the number of times, the precharge amount can be comprehensively adjusted, and optimal conditions can be simply obtained. Further, regarding the amount of electrons, when the absorption current flowing in the holder is monitored, the optimal conditions can be determined and whether the precharge is normally performed can be deter determined. When this absorption current is monitored in each precharge, whether or not a charge state is normal can be determined. Therefore, the apparatus can automatically inspection whether or not the inspection result is normal, and inspection a process for retrial or inspection interruption. As a result, when the inspection fails to be normally performed, the apparatus can prevent the inspection result from being output and improve its reliability.

As can be seen from the above discussion, according to the present embodiment of the invention, a technology of inspecting a pattern in which charge of a semiconductor apparatus is put to a practical use, for example, a contact hole in high sensitivity and high accuracy can be provided. Therefore, failure contents in an important wiring process can be early detected in the manufacturing process of the semiconductor apparatus. In addition, a defect position and size information required for performing countermeasures for faults can be acquired at the same time as the inspection, and a TAT up to the countermeasures can be shortened. As a result, a large effect capable of improving a yield of the semiconductor apparatus or elevating productivity is exerted.

As described above, about a configuration of a typical apparatus and inspection method of the present invention, the description is made on embodiments of an operation screen for determining a flow of a specific inspection, and an operation and inspection conditions of each portion; and an operation method of an inspection and inspection condition setting. The proposed pattern inspection apparatus and pattern inspection method can applied also to an inspection method and inspection apparatus in which a plurality of characteristics described in claims are combined without departing from the scope of this invention.

REFERENCE SIGNS LIST

3 Electron beam
7 Wafer
13 Holder
17 Retarding power supply
18, 19 Electrode
20 Precharge unit
25 Image processing unit
31 Image display unit
32 Pin
33 Precharge power supply
34 Ammeter
35 Switching unit
36 Precharge unit power supply
37 Controller
38 Shutter

The invention claimed is:

1. A pattern inspection apparatus having an irradiation means which irradiates an electron beam onto a surface of a substrate on which a pattern is formed, a detection means which detects a signal generated from the substrate, an image means which images a signal detected by the detection means, a comparison means which compares both images imaged by the image means and inspections the substrate, comprising:
a charge formation means to form charge on a surface of the substrate by generating an electron from a second electron source which is different from an electron source which generates the electron beam before irradiating the electron beam;
a current measuring means to measure a value of a current flowing in the substrate while the charge is formed on a surface of the substrate by the charge formation means; and
an adjustment means to adjust the charge formed by the charge formation means so that the value of the current measured by the current measuring means is a predetermined target value.

2. The pattern inspection apparatus according to claim 1, wherein the adjustment means adjusts an emission current of electron irradiation by the second electron source and adjusts the charge.

3. The pattern inspection apparatus according to claim 1, wherein:
electrodes are further provided over the substrate; and
the adjustment means adjusts a voltage applied to the electrodes and adjusts the charge.

4. The pattern inspection apparatus according to claim 1, wherein:
the adjustment means adjusts, when a target value of the value of the current flowing in the substrate is positive, the charge so that positive charge is formed on a surface of the substrate; and
when a target value of the value of the current flowing in the substrate is negative, the charge so that negative charge is formed on a surface of the substrate.

5. The pattern inspection apparatus according to claim 1, further comprising a power supply to apply a negative voltage to the substrate when the electron beam is irradiated onto a surface of the substrate.

6. The pattern inspection apparatus according to claim 5, further comprising:
a second power supply to apply a voltage to the substrate when a current flowing in the substrate is measured by the current measuring means; and
a switching means to switch the second power supply and a power supply which applies a negative voltage to the substrate.

7. A pattern inspection apparatus to generate an image from a secondary signal generated by irradiating an electron beam onto a surface of a substrate on which a pattern is formed, and extract defect coordinates of the pattern by comparing and calculating both the images, comprising:
a precharge unit to irradiate an electron prior to irradiation of the electron beam onto the substrate;
a controller to set at least one of an emission current of the precharge unit, a voltage applied to electrodes provided over the substrate, a voltage applied to the substrate, a moving speed of the substrate, the number of times of irradiation of the electron;
a stage to continuously move the substrate during the irradiation of electrons by the precharge unit;
a first power supply to supply a voltage to the substrate; and
an ammeter to measure a current value at the time of supplying a voltage to the substrate by the first power supply,
wherein the controller determines a value of an emission current to the precharge unit and supplies based on the current value measured by the ammeter.

8. The pattern inspection apparatus according to claim 7, wherein the controller unloads, when a current value measured by the ammeter exceeds a predetermined threshold, the substrate from the stage, reloads the substrate, and performs the irradiation of electrons by the precharge unit again.

9. The pattern inspection apparatus according to claim 7, further comprising:
a second power supply to supply a retarding voltage which decelerates the electron beam to the substrate; and
a switching unit to switch the first power supply and the second power supply, wherein:
the switching unit switches, when an electron beam is irradiated onto the substrate by the precharge unit; over to the first power supply and supplies a voltage to the substrate; and
when the electron beam is irradiated onto the substrate to acquire an image, over to the second power supply and supplies a voltage to the substrate.

10. The pattern inspection apparatus according to claim 7, wherein the controller can switch a polarity of a voltage applied to electrodes provided over the substrate.

11. A pattern inspection method for irradiating an electron beam onto a surface of a substrate on which a pattern is formed, detecting a signal generated from the substrate, imaging the detected signal, comparing both imaged images, and inspecting the substrate, comprising:

generating an electron from a second electron source which is different from an electron source which generates the electron beam and forming charge on a surface of the substrate before irradiating the electron beam;

measuring a value of a current flowing in the substrate while the charge is formed on a surface of the substrate by the second electron source; and adjusting the charge formed by the second electron source so that a value of the measured current is a predetermined target value.

12. The pattern inspection method according to claim 11, wherein an emission current of electron irradiation by the second electron source is adjusted and the charge is adjusted.

13. The pattern inspection method according to claim 11, wherein:

electrodes are further provided over the substrate; and a voltage applied to the electrodes is adjusted and the charge is adjusted.

14. The pattern inspection method according to claim 11, wherein:

the charge is adjusted, when a target value of a value of a current flowing in the substrate is positive, so that positive charge is formed on a surface of the substrate; and when a target value of a value of a current flowing in the substrate is negative, so that negative charge is formed on a surface of the substrate.

15. The pattern inspection method according to claim 11, wherein when the electron beam is irradiated onto a surface of the substrate, a negative voltage is applied to the substrate from a first power supply.

16. The pattern inspection method according to claim 15, wherein:

when a current flowing in the substrate is measured, a second power supply which applies a voltage to the substrate is provided; and the second power supply and the first power supply which applies a negative voltage to the substrate are switched.

* * * * *